(12) United States Patent
Chang et al.

(10) Patent No.: US 8,211,617 B2
(45) Date of Patent: Jul. 3, 2012

(54) SOLID INKS FOR PRINTED MASKS

(75) Inventors: Norine E. Chang, Menlo Park, CA (US); C. Wayne Jaeger, Lake Oswego, OR (US); Scott Jong Ho Limb, Palo Alto, CA (US); Eric J. Shrader, Belmont, CA (US); Francisco E. Torres, San Jose, CA (US); Kris Schmidt, Granada Hills, CA (US)

(73) Assignee: Palo Alto Research Center Incorporated, Palo Alto, CA (US)

( * ) Notice: Subject to any disclaimer, the term of this patent is extended or adjusted under 35 U.S.C. 154(b) by 376 days.

(21) Appl. No.: 12/542,171

(22) Filed: Aug. 17, 2009

(65) Prior Publication Data

US 2011/0039193 A1   Feb. 17, 2011

(51) Int. Cl.
  *G03F 7/00* (2006.01)
  *G03F 7/26* (2006.01)
  *G03F 7/40* (2006.01)
  *G04F 7/004* (2006.01)

(52) U.S. Cl. .................. 430/270.1; 430/318; 430/322

(58) Field of Classification Search .............. 430/270.1, 430/5
See application file for complete search history.

(56) References Cited

U.S. PATENT DOCUMENTS

| | | | |
|---|---|---|---|
| 3,668,131 A | 6/1972 | Banush et al. | |
| 3,715,219 A | 2/1973 | Kurz et al. | |
| 3,773,577 A | 11/1973 | Shibasaki et al. | |
| 4,130,454 A | 12/1978 | Dutkewych et al. | |
| 4,144,119 A | 3/1979 | Dutkewych et al. | |
| 4,437,931 A | 3/1984 | Elias et al. | |
| 4,849,124 A | 7/1989 | Backus | |
| 4,859,281 A | 8/1989 | Goltz | |
| 4,908,063 A | 3/1990 | Baker et al. | |
| 5,496,879 A | 3/1996 | Griebel et al. | |
| 5,757,408 A * | 5/1998 | Malhotra | 347/105 |
| 6,547,380 B2 | 4/2003 | Smith et al. | |
| 6,872,320 B2 | 3/2005 | Wong et al. | |
| 7,632,621 B2 * | 12/2009 | Anzures et al. | 430/270.1 |
| 2005/0164121 A1 | 7/2005 | Anzures et al. | |
| 2006/0121389 A1 * | 6/2006 | Anzures et al. | 430/270.1 |
| 2007/0120925 A1 * | 5/2007 | Belelie et al. | 347/100 |
| 2008/0241712 A1 | 10/2008 | Limb et al. | |
| 2009/0088492 A1 | 4/2009 | Yokoi | |
| 2009/0123873 A1 * | 5/2009 | Shrader et al. | 430/311 |
| 2010/0215865 A1 * | 8/2010 | Keoshkerian et al. | 427/511 |
| 2010/0261103 A1 | 10/2010 | Sasaki et al. | |

FOREIGN PATENT DOCUMENTS

EP  1 553 445 A2  7/2005
EP  1 630 600 A2  3/2006

OTHER PUBLICATIONS

European Search Report for European Application No. EP 10 17 2470, mailed Oct. 13, 2010.
U.S. Appl. No. 12/542,172, filed Aug. 17, 2009.
Mar. 29, 2012 Office Action issued in copending U.S. Appl. No. 12/542,172.

* cited by examiner

*Primary Examiner* — Amanda C. Walke
(74) *Attorney, Agent, or Firm* — Oliff & Berridge, PLC

(57) ABSTRACT

A printed mask derived from a composition comprised of at least one compound including at least one alkaline-hydrolyzable group, and at least one compound including at least one ethylene oxide group. The printed mask is removable using an alkaline solution in about 30 seconds or less.

14 Claims, 2 Drawing Sheets

SOLID INKS FOR PRINTED MASKS

CROSS-REFERENCE TO RELATED APPLICATIONS

Disclosed in commonly assigned U.S. patent application Ser. No. 12/542,172 filed Aug. 17, 2009, is a printed mask derived from a composition comprised of at least one compound including at least one alkaline-hydrolyzable group, at least one compound including at least one ethylene oxide group and at least one ultraviolet radiation blocking agent, wherein the printed mask is removable using an alkaline solution in about 30 seconds or less.

The entire disclosure of the above-mentioned application is totally incorporated herein by reference.

BACKGROUND

Described herein are solid compositions used in printed masks for printed circuit boards.

Printed circuit boards (PCBs) or printed wiring boards (PWBs) (hereinafter collectively PCBs) are platforms that connect and interface most electronic components with each other and with other elements in computers, communication devices, consumer electronics, automated manufacturing and inspection equipment. PCBs may be produced from a base of insulating material on which a thin copper layer is laminated or plated, known as a bare copper plated board, from which an etching step selectively removes areas of the copper to produce electrically conductive pathways.

This selective removal is achieved by applying a printed mask or photo-patterned etch-resist (photoresist) in a pattern on the copper layer. In the photo patterned case, the PCB is then subjected to a light source that causes the printed mask to become resistant a developer solution. The developer solution is then used to remove the unexposed photoresist leaving bare copper exposed in a pattern. In the printed mask case, the printed mask material is designed to be resistant to the acid etchant. In both cases, the PCB is then treated with an etchant such that areas of the copper plated board not coated with the patterned mask material are etched away, leaving just the pattern. The patterned mask material itself may then be removed with an aqueous base solvent, thereby leaving the electrically conductive pathways formed on the PCB.

Conductive layers on PCBs may also be produced by plating copper onto an insulating layer with a plating seed layer on the insulating layer. This process is often used as the outer layer process because it has the additional benefit of plating through holes in the PCB to allow layer interconnect. In the plating case, masking layers are described as in the etching case either by photoresist or printing, but instead of copper being treated with an etchant, the board is treated with a plating solution. The plating solution applies copper or other metals onto the surface of the board that is not covered by masking material. The masking material and the seed layer are then stripped off, leaving metal traces in the pattern.

In either process while the aqueous base solvent removes some of the printed mask, such removal is often inadequate or requires excessive processing time because these solvents do not strip off the printed mask quickly or in sufficient detail as to not require further removal effort, such as undercutting.

SUMMARY

Accordingly, the present application is directed to a solid ink composition used for a printed mask that can be removed quickly and efficiently by a suitable alkaline solvent. Such a mask would thus be suitable for all PCBs and PCB manufacturing processes using a printed mask and reduce the manufacturing costs associated with the use of more expensive masking processes such as photoresist processes.

The above and other issues are addressed by the present application, wherein in embodiments, the application relates a printed mask derived from a composition comprised of at least one compound including at least one alkaline-hydrolyzable group, and at least one compound including at least one ethylene oxide group, wherein the printed mask is removable using an alkaline solution in about 30 seconds or less.

In embodiments, described is a printed mask derived from a composition comprised of at least one compound including at least one alkaline-hydrolyzable group, and at least one compound including at least one ethylene oxide group, wherein the printed mask is removable using an alkaline solution in about 30 seconds or less, and wherein the composition does not include an ultraviolet absorber.

In further embodiments, described is a method of forming a pattern on a substrate, the method comprising: applying a metal layer to the substrate, selectively applying a composition to the metal layer to form a composite structure, wherein the composition is comprised of: at least one compound including one alkaline-hydrolyzable group, and at least one compound including at least one ethylene oxide group, contacting the composite structure with an etching solution to remove portions of the metal layer not covered by the composition, and applying an alkaline solution after contacting the composite structure with an etching solution to remove the composition in about 30 seconds or less to form the image on the substrate.

BRIEF DESCRIPTION OF THE DRAWINGS

Illustrated in FIG. 1 is the differential scanning calorimetry data for the printed mask composition of Example 1.

Illustrated in FIG. 2 is the differential scanning calorimetry data for the printed mask composition of Example 2.

EMBODIMENTS

Figure 1:
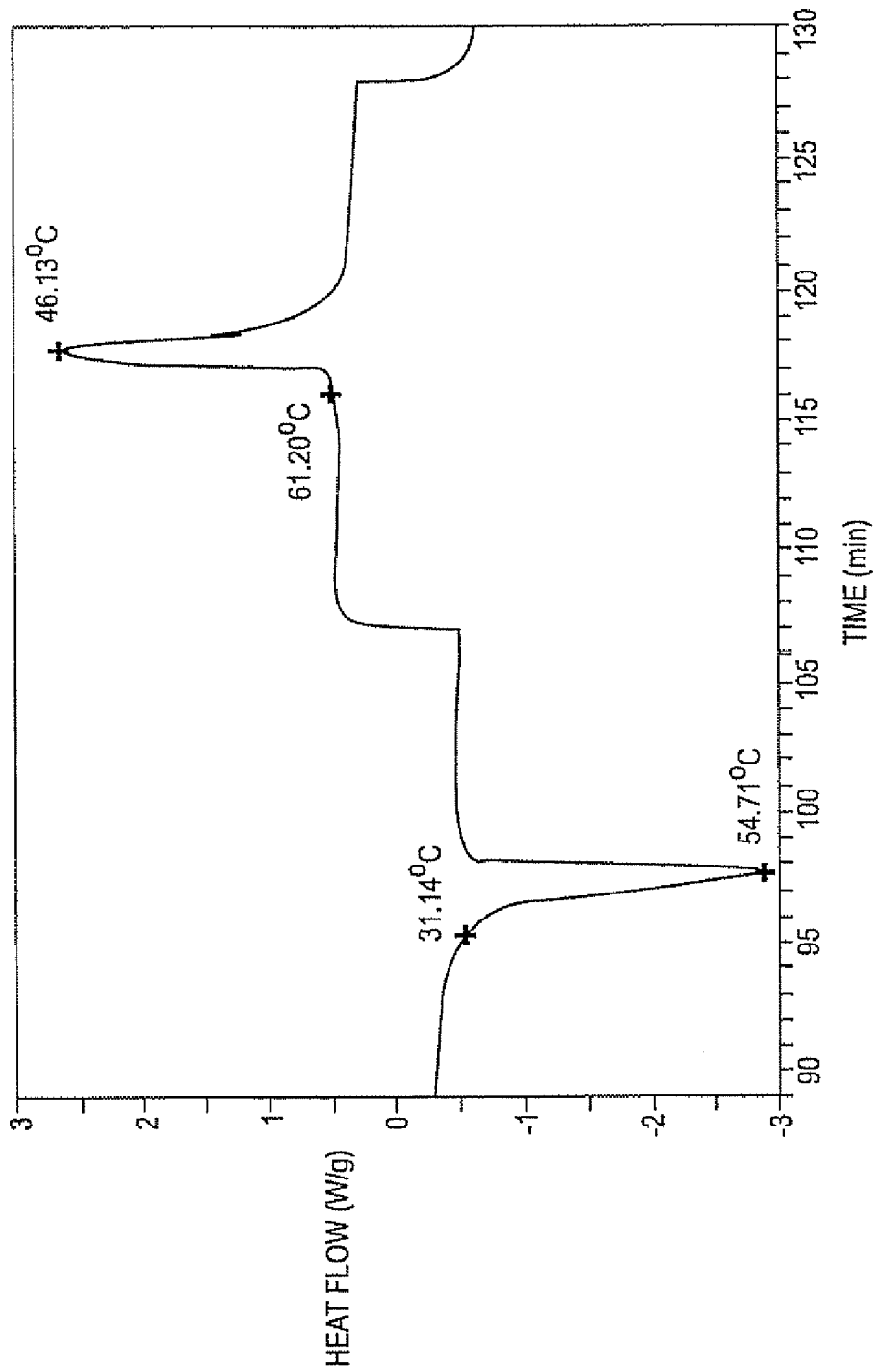

Described herein is a printed mask derived from a composition comprised of at least one compound including at least one alkaline-hydrolyzable group, and at least one compound including at least one ethylene oxide group, wherein the printed mask is removable using an alkaline solution in about 30 seconds or less.

The compound containing at least one alkaline-hydrolyzable group may be an unsubstituted or substituted aliphatic carboxylic acid having from about 10 to about 50 carbon atoms, such as from about 14 to about 22 carbon atoms, or from about 16 to about 20 carbon atoms. Examples of suitable aliphatic carboxylic acids include saturated aliphatic carboxylic acids such as dodecanoic acid, tridecanoic acid, tetradecanoic acid, pentadecanoic acid, hexadecanoic acid (palmitic acid), heptadecanoic acid, octadecanoic acid (stearic acid), nonadecanoic acid, icosanoic acid, docosanoic acid (behenic acid), hexacosanoic acid, and tetracosanoic acid (lignoceric acid) and unsaturated aliphatic carboxylic acids such as palmitoleic acid, oleic acid, linoleic acid, linolenic acid, cicosenoic acid, eicosapentaenoic acid and cetoleic acid. Further examples include linear carboxylic acids such as UNICID carboxylic acid polymers including UNICID 350, UNICID 425, UNICID 550, and UNICID 700 (manufactured by the Baker-Petrolite Corporation). A saturated aliphatic carboxylic acid is desired to maintain the composition's stability in the heated printhead.

The composition may also comprise, alone or in combination with the above at least one compound including an alkaline-hydrolyzable group, at least one compound including two alkaline-hydrolyzable groups. Suitable examples of such a compound is a dioic acid of the formula $$COOH\text{—}(C_aH_b)\text{—}COOH$$

wherein a is an integer from about 5 to about 24, such as from about 10 to about 24, from about 14 to about 20 or from about 16 to about 20, and b is an integer twice the value of a. Examples of dioic acids include pimelic acid, suberic acid and a mixture of higher molecular weight acids such as COR-FREE M1 (available from DuPont). A higher functionality acid such as a trioic acid may also be used. The beneficial aspects of a dioic acid include that because the alkaline base can generate two or more charge groups per molecule and the charge groups are good for dissolution/solubility, two or more acid groups per molecule will lead to faster dissolution of the printed mask.

The composition may further comprise at least one monohydric alcohol of the formula

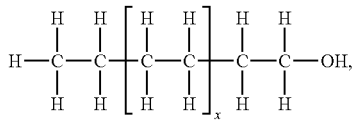

wherein x is an integer of from about 8 to about 30, such as from about 12 to about 22, or from about 14 to about 20. Examples of suitable monohydric alcohols or "fatty alcohols" include dodecanol, tridecanol, tetradecanol, pentadecanol, hexadecanol, heptadecanol, octadecanol, nonadecanol, eicosanol, heneicosanol, tricosanol, and the like.

The compound containing at least one alkaline-hydrolyzable group may be present in the composition in an amount of at least about 2% by weight of the composition, such as for example from about 2 to about 99% by weight of the composition, from about 2 to about 90% by weight of the composition, from about 3 to about 80% by weight of the composition, from about 5 to about 60% of the composition, from abut 10 to about 50% by weight of the composition, and from about 10 to about 30% by weight of the composition.

The compound including at least one ethylene oxide group may be an ethoxyated alcohol or an ester of an ethoxylated alcohol. Ethoxylated alcohols (linear) are condensation products of aliphatic alcohols and are comprised of an alkyl portion and an ethylene oxide (EO) portion. Suitable ethoxylated alcohols are also disclosed in, for example, U.S. Pat. No. 4,908,063, the disclosure of which is incorporated herein by reference in its entirety. Ethoxylated alcohols are represented by the formula:

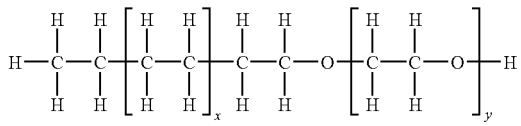

wherein x is an integer of from about 1 to about 50, such as from about 5 to about 40, from about 10 to about 30 or from about 15 to about 25 and y is an integer of from about 1 to about 70, such as from about 1 to about 50, from about 10 to about 40 or from about 1 to about 25. The materials may have a melting point of from about 60° C. to about 150° C., such as from about 70° C. to about 120° C. or from about 80° C. to about 110° C. and a number average molecular weight (Mn) range of from about 100 to about 5,000, such as from about 500 to about 3,000 or from about 500 to about 2,500. Commercial examples include UNITHOX 420 (Mn=560), UNITHOX 450 (Mn=900), UNITHOX 480 (Mn=2,250), UNITHOX 520 (Mn=700), UNITHOX 550 (Mn=1,100), UNITHOX 720 (Mn=875), UNITHOX 750 (Mn=1,400), and the like.

If the composition comprises an ethoxylated alcohol and an aliphatic carboxylic acid, the addition of the ethoxylated alcohol disrupts the crystallinity of the composition and adds additional polar groups to aid in the strippability. For example, upon mixing the ethoxylated alcohol with the aliphatic carboxylic acid described above at a temperature of from about 100° C. to about 150° C., from about 110° C. to about 150° C. or from about 120° C. to about 130° C., the alcohol end portion of the ethoxylated alcohol reacts with carboxyl end groups of the aliphatic carboxylic acid to form an ester. This reaction disrupts the crystallinity of the composition and adds polar groups that aid in the stripping or removal of the composition with a polar alkaline solution.

Suitable ethoxylated alcohol condensation products of a higher molecular weight alcohol (for example an alcohol having at least eight carbon atoms) in a straight or branched chain configuration, condensed with about 4 to 20 moles of EO per mole of alcohol, include, for example, lauryl or myristyl alcohol condensed with about 16 moles of EO per mole of alcohol, tridecanol condensed with about 6 to 15 moles of EO per mole of alcohol, myristyl alcohol condensed with about 10 moles of EO per mole of alcohol, tallow alcohol ethoxylates containing 6 moles of EO to 11 moles of EO per mole of alcohol, and coconut fatty alcohol ethoxylates containing about 6 moles of EO to about 9 moles of EO per mole of alcohol.

Other examples of suitable ethoxylated alcohols include NEODOL ethoxylates (available from Shell Company, Texas), which are higher aliphatic, primary alcohols containing about 9-15 carbon atoms, for example, a $C_9$-$C_{11}$ alkanol condensed with 4 to 10 moles of EO (NEODOL 91-8 or NEODOL 91-5), a $C_{12}$-$C_{13}$ alkanol condensed with 6.5 moles EO (NEODOL 23-6.5), a $C_{12}$-$C_{15}$ alkanol condensed with 12 moles EO (NEODOL 25-12), a $C_{14}$-$C_{15}$ alkanol condensed with 13 moles EO (NEODOL 45-13), a $C_{12}$ alkanol condensed with 7 moles of EO (NEODOL 1-7), a $C_9$-$C_{11}$ alkanol condensed with an average of 2.5 moles of EO (NEODOL 91-2.5), a $C_9$-$C_{11}$ alkanol condensed with 6 moles of EO (NEODOL 91-6), a $C_9$-$C_{11}$ alkanol condensed with 8 moles of EO (NEODOL 91-8), a $C_{12}$-$C_{13}$ alkanol condensed with 6.5 moles EO (NEODOL 23-6.5), a $C_{12}$-$C_{13}$ alkanol condensed with 7 moles EO (NEODOL 23-7), a $C_{12}$-$C_{15}$ alkanol condensed with 7 moles of EO (NEODOL 25-7), a $C_{12}$-$C_{15}$ alkanol condensed with 9 moles EO (NEODOL 25-9), a $C_{12}$-$C_{15}$ alkanol condensed with 12 moles EO (NEODOL 25-12), and a $C_{14}$-$C_{15}$ alkanol condensed with 13 moles EO (NEODOL 45-13).

Other examples of ethoxylated alcohols suitable for use are available also from Cognis Corporation under the trademark TRYCOL ST-8049, which is an ethoxylated $C_8$-$C_{10}$ alcohol with about 4 moles of EO, and also ALFONIC 810-4.5, an ethoxylated $C_8$-$C_{10}$ alcohol with 4.5 moles of EO available from Sasol Corp. Further examples of ethoxylated alcohols include the condensation products of secondary aliphatic alcohols containing 8 to 18 carbon atoms, in either a straight or branched chain configuration, condensed with 5 to 30 moles of ethylene oxide. Examples of commercially available nonionic detergents include $C_{11}$-$C_{15}$ secondary alkanol condensed with either 9 moles EO (TERGITOL 15-S-9) or 12 moles EO (TERGITOL 15-S-12) marketed by Union Carbide.

Prior to the present application, UV absorbers, such as those described in U.S. Patent Application Pub. No. 2005/0164121, which is incorporated herein by reference, were included in printed mask compositions to prevent or "block out" UV radiation. However, in embodiments, the composition described herein is substantially free of and/or does not contain any UV absorber. Because the printed mask composition may scatter or reflect UV light without the addition of a UV absorber, a UV absorber is not required.

In embodiments, the composition may further comprise at least one additive selected from the group consisting of a plasticizer, a tackifier, and other suitable additives.

Plasticizers may be selected from the group consisting of UNIPLEX 250 (commercially available from Uniplex), the phthalate ester plasticizers commercially available from Monsanto under the trade name SANTICIZER., such as dioctyl phthalate, diundecyl phthalate, alkylbenzyl phthalate (SANTICIZER 278), triphenyl phosphate (commercially available from Monsanto), KP-140, a tributoxyethyl phosphate (commercially available from FMC Corporation), MORFLEX 150, a dicyclohexyl phthalate (commercially available from Morflex Chemical Company Inc.), trioctyl trimellitate (commercially available from Eastman Kodak Co.), and the like. Plasticizers may be present in an amount from about 0.01 percent by weight of the composition to from about 98 percent by weight of the composition, from about 0.1 percent by weight of the composition to about 50 percent by weight of the composition, from about 1 weight percent of the composition to about 10 weight percent of the composition.

The composition may further contain a tackifier selected from the group consisting of FORAL 85, a glycerol ester of hydrogenated abietic (rosin) acid (commercially available from Hercules), FORAL 105, a pentaerythritol ester of hydroabietic (rosin) acid (commercially available from Hercules), CELLOLYN 21, a hydroabietic (rosin) alcohol ester of phtlialic acid (commercially available from Hercules), ARAKAWA KE-311 and KE-100 Resins, triglycerides of hydrogenated abietic (rosin) acid (commercially available from Arakawa Chemical Industries, Ltd.), synthetic polyterpene resins such as NEVTAC 2300, NEVTAC 100, and NEVTACO 80 (commercially available from Neville Chemical Company), WINGTACK 86, a modified synthetic polyterpene resin (commercially available from Goodyear), and the like. Tackifiers may be present in the composition in any effective amount, such as from about 0.01 percent by weight of the composition to from about 50 percent by weight of the composition, from about 0.1 percent by weight of the composition to about 20 percent by weight of the composition or from about 5 weight percent of the composition to about 10 weight percent of the composition.

The composition of embodiments may further include conventional additives to take advantage of the known functionality associated with such conventional additives. Such additives may include, for example, a polyamide resin, biocide, antioxidant, adhesive, and the like.

In embodiments, the composition may further comprise a suitable polyamide resin to tackify or increase the viscosity of the composition, or increase the solubility of at least one of the other components in the composition. Examples of suitable polyamide resins include polyesteramide resins of weight average molecular weight of less than 15,000 g/mole, available from Arizona Chemical and sold under the tradename UNIREZ, such as, for example, such as UNIREZ 2970, UNIREZ 2974 and UNIREZ 2980. These resins have a softening point from about 90° C. to about 140° C. and a viscosity at 130° C. between about 20 to about 150 cP.

Biocides may be present in amounts of from about 0.1 to about 1.0 percent by weight of the composition. Suitable biocides include, for example, sorbic acid, 1-(3-chloroallyl)-3,5,7-triaza-1-azoniaadamantane chloride, commercially available as DOWICIL 200 (Dow Chemical Company), vinylene-bis thiocyanate, commercially available as CYTOX 3711 (American Cyanamid Company), disodium ethylenebis-dithiocarbamate, commercially available as DITHONE D14 (Rohm & Haas Company), bis(trichloromethyl)sulfone, commercially available as BIOCIDE N-1386 (Stauffer Chemical Company), zinc pyridinethione, commercially available as zinc omiadine (Olin Corporation), 2-bromo-t-nitropropane-1,3-diol, commercially available as ONYXIDE 500 (Onyx Chemical Company), BOSQUAT MB50 (Louza, Inc.), and the like.

The composition may contain antioxidants to protect the composition components from oxidation while existing as a heated melt in the reservoir. Examples of suitable antioxidants include (1) N,N'-hexamethylene bis(3,5-di-tert-butyl-4-hydroxy hydrocinnamamide) (IRGANOX 1098, available from Ciba-Geigy Corporation), (2) 2,2-bis(4-(2-(3,5-di-tert-butyl-4-hydroxyhydrocinnamoyloxy))ethoxyphenyl) propane (TOPANOL-205, available from ICI America Corporation), (3) tris(4-tert-butyl-3-hydroxy-2,6-dimethyl benzyl) isocyanurate (CYANOX 1790, 41,322-4, LTDP, Aldrich D12, 840-6), (4) 2,2'-ethylidene bis(4,6-di-tert-butylphenyl)fluoro phosphonite (ETHANOX-398, available from Ethyl Corporation), (5) tetrakis(2,4-di-tert-butylphenyl)-4,4'-biphenyl diphosphonite (ALDRICH 46,852-5; hardness value 90), (6) pentaerythritol tetrastearate (TCI America #PO739), (7) tributylammonium hypophosphite (Aldrich 42,009-3), (8) 2,6-di-tert-butyl-4-methoxyphenol (Aldrich 25,106-2), (9) 2,4-di-tert-butyl-6-(4-methoxybenzyl)phenol (Aldrich 23,008-1), (10) 4-bromo-2,6-dimethylphenol (Aldrich 34,951-8), (11) 4-bromo-3,5-didimethylphenol (Aldrich B6,420-2), (12) 4-bromo-2-nitrophenol (Aldrich 30,987-7), (13) 4-(diethyl aminomethyl)-2,5-dimethylphenol (Aldrich 14,668-4), (14) 3-dimethylaminophenol (Aldrich D 14,400-2), (15) 2-amino-4-tert-amylphenol (Aldrich 41,258-9), (16) 2,6-bis(hydroxymethyl)-p-cresol (Aldrich 22,752-8), (17) 2,2'-methylenediphenol (Aldrich B4,680-8), (18) 5-(diethylamino)-2-nitrosophenol (Aldrich 26,951-4), (19) 2,6-dichloro-4-fluorophenol (Aldrich 28,435-1), (20) 2,6-dibromo fluoro phenol (Aldrich 26,003-7), (21) α-trifluoro-o-cresol (Aldrich 21,979-7), (22) 2-bromo-4-fluorophenol (Aldrich 30,246-5), (23) 4-fluorophenol (Aldrich F1,320-7), (24) 4-chlorophenyl-2-chloro-1,1,2-tri-fluoroethyl sulfone (Aldrich 13,823-1), (25) 3,4-difluoro phenylacetic acid (Aldrich 29,043-2), (26) 3-fluorophenylacetic acid (Aldrich 24,804-5), (27) 3,5-difluoro phenylacetic acid (Aldrich 29,044-0), (28) 2-fluorophenylacetic acid (Aldrich 20,894-9), (29) 2,5-bis(trifluoromethyl)benzoic acid (Aldrich 32,527-9), (30) ethyl-2-(4-(4-(trifluoromethyl)phenoxy)phenoxy)propionate (Aldrich 25,074-0), (31) tetrakis (2,4-di-tert-butyl phenyl)-4,4'-biphenyl diphosphonite (Aldrich 46,852-5), (32) 4-tert-amyl phenol (Aldrich 15,384-2), (33) 3-(2H-benzotriazol-2-yl)-4-hydroxy phenethylalcohol (Aldrich 43,071-4), NAUGARD 76, NAUGARD 445, NAUGARD 512, and NAUGARD 524 (manufactured by Uniroyal Chemical Company), and the like, as well as mixtures thereof. The antioxidant, when present, may be present in the composition in any desired or effective amount, such as from about 0.25 percent to about 10 percent by weight of the composition or from about 1 percent to about 5 percent by weight of the composition.

Adhesives, such as VERSAMID 757, 759, or 744 (commercially available from Henkel) may be present in the composition from about 0.01 percent by weight of the composition to from about 98 percent by weight of the composition, from about 0.1 percent by weight of the composition to about 50 percent by weight of the composition, from about 5 weight percent of the composition to about 10 weight percent of the composition.

When present, the additives may each, or in combination, be present in the composition in any desired or effective amount, such as from about 1 percent to about 10 percent by weight of the composition or from about 3 percent to about 5 percent by weight of the composition.

The composition herein may function in a similar manner to a phase change ink. Phase change inks (sometimes referred to as "solid inks" and "hot melt inks") have been used in various liquid deposition techniques. Phase change inks often contain a "phase change agent" that enables the ink to exist in a solid phase at ambient temperatures, but also exist in the liquid phase at the elevated operating temperature of an ink jet printing device. At the deposit operating temperature, droplets of liquid ink are ejected from the printing device and, as the ink is jetted towards or contacts the surface of the recording substrate, either directly or via an intermediate heated transfer belt or drum, the ink quickly solidifies to form a predetermined pattern of solidified ink drops. Phase change inks have also been used in other printing technologies, such as gravure printing, as disclosed in, for example, U.S. Pat. No. 5,496,879, the disclosure which is incorporated herein by reference.

The composition herein is desirably applied using ink jet printers because they remain in a solid phase at room temperature during shipping, long term storage, and the like. In addition, the problems associated with nozzle clogging as a result of the composition evaporation with solvent based ink jet inks are largely eliminated, thereby improving the reliability of the ink jet printing. Further, when the composition droplets are applied directly onto PCB material, the droplets solidify immediately upon contact with the substrate, so that migration of ink along thesurface is prevented and dot and edge quality is improved.

In general, the composition is in the solid phase at, for example, ambient or room temperature, such as about 20° C. to about 27° C., but exist in the liquid phase at the elevated operating temperature of an ink jet printing device. At the jet operating temperature, the ink is molten and droplets of liquid ink are ejected from the printing device.

In embodiments, the composition may have a melting point of from about 40° C. to about 85° C., for example from about 40° C. to about 60° C., from about 45° C. to about 55° C. or from about 45° C. to about 50° C. as determined by, for example, observation and measurement on a microscope hot stage, wherein the composition is heated on a glass slide and observed by microscope, or characterized by different scanning calorimetry. Furthermore, the composition may have a jetting viscosity of about 5 cP to about 25 cP.

In embodiments, a metal surface may be applied to a substrate in a masked pattern by any suitable method, such as electroless, electrolytic, and immersion bath. Metals that may be deposited by plating include, but are not limited to, noble and non-noble metals and their alloys. Examples of suitable noble metals include, gold, silver, platinum, palladium and their alloys. Examples of suitable non-noble metals include, copper, nickel, cobalt, lead, iron, bismuth, zinc, ruthenium, rhodium, rubidium, indium, and their alloys.

The substrate may be composed of, for example, silicon, glass plate, plastic film or sheet. For structurally flexible devices, a plastic substrate, such as, for example, polyester, polyearbonate, polyimide sheets and the like may be used. The thickness of the substrate may be from amount 10 micrometers to about 10 millimeters, from about 50 micrometers to about 2 millimeters, especially for a flexible plastic substrate and from about 0.4 millimeters to about 10 millimeters for a rigid substrate such as glass or silicon.

Any suitable ink-jet apparatus or device may be employed to selectively apply the printed mask composition in a pattern to the metal layer. The combination of the metal layer and the printed mask is referred to herein as the composite structure. Further, the pattern of the printed mask will be substantially the same as the pattern of the electrically conductive pathways. Ink jetting devices are known in the art, and thus extensive description of such devices is not required herein. As described in U.S. Pat. No. 6,547,380, incorporated herein by reference in its entirety, ink jet printing systems generally are of two types: continuous stream and drop-on-demand.

After the application of the printing mask, the entire substrate is treated with an etching solution such that areas of the metal layer not coated with the printed mask are etched away, leaving just the pattern. Suitable etching solutions have pH ranges of from 2 to 6.5, or such as from 3 to 6, or such as from 3.5 to 5.5. The etching solution is comprised of a solute dissolved in water. Examples of solutes in the etching solution include copper chloride, ferric chloride, chromium salt, hydrogen peroxide-sulfuric acid and hydrogen peroxide-nitric acid. Other examples of the etching compound include those described in U.S. Pat. Nos. 4,144,119, 4,437,931, 3,666,131, 4,849,124, 4,130,454, 4,859,281 and U.S. Pat. No. 3,773,577, each of which are incorporated by reference herein in their entirety. The solute may be present in the etching solution in an amount of 0.1 to 90 percent by weight of the etching solution.

The printed mask may then be removed or "stripped" in less than about 30 seconds with an alkaline solution (aqueous base) after the etching solution has substantially removed or entirely removed the portions of the metal layer not coated with the printed mask. The printed mask is thus removable in about 30 seconds or less.

Suitable alkaline solutions have pH ranges of from 7.5 to 14, or such as from 8 to 13, or such as from 9 to 12. The alkaline solution is typically comprised of a metal hydroxide solute or a metal carbonate solute dissolved in water. Examples of suitable solutes include alkali metal hydroxides, such as, for example, sodium hydroxide and potassium hydroxide, and alkali metal carbonates such as sodium carbonate and potassium carbonate. The amount of solute may be present in the alkaline solution from about 0.05 percent by weight of the alkaline solution to from about 5 percent by weight of the alkaline solution, from about 0.1 percent by weight of the alkaline solution to about 4 percent by weight of the alkaline solution, from about 1 weight percent of the alkaline solution to about 2 weight percent of the alkaline solution.

EXAMPLES

Example 1

Preparation of Composition A

A composition was prepared by forming a mixture comprised of 63.75 parts by weight of hexadecanoic acid (palmitic acid), 63.75 parts by weight of octadecanoic acid (stearic acid), 63.75 parts by weight of docosanoic acid (behenic acid) and 50.00 parts by weight of UNITHOX 450 (an ethoxylated alcohol) at 130° C. for two hours with one standard cubic feet per hour (SCFH) nitrogen bubbling in a three lobe impeller at 445 RPM. The nitrogen bubbling serves to remove water from the condensation of UNITHOX 450 and the acids. After mixing, the mixture was cooled to 90° C. and first filtered through Whatman Grade No. 42 Quantitative Filter Paper and again filtered with an Advantex PTFE 1 micron filter.

Example 2

Printing of Composition A to Form Printed Mask A

Before printing on a glass substrate, the viscosity, melting temperature and solidification temperature of Composition A were each measured to verify that Composition A was suitable for inkjet printing. The viscosity of Composition A at various temperatures was measured using a Brookfield Rheometer. These viscosity results are illustrated below in Table 1.

TABLE 1

Viscosity Results of Example 1

| Temperature (° C.) | Viscosity (cP) |
|---|---|
| 79.9 | 12.93 |
| 84.9 | 11.22 |
| 90.1 | 9.87 |
| 95.2 | 9.03 |
| 100.1 | 8.19 |
| 105.0 | 7.62 |
| 110.0 | 6.93 |
| 115.1 | 6.60 |

Furthermore, the melt temperature and the solidification temperature of Composition A were measured using a differential scanning calorimetry device (DSC). As shown in FIG. 1, the melting temperature of Composition A was 54.71° C. and the solidification temperature was 46.13° C. The results in Table 1 and FIG. 1 indicate that Composition A was suitable for inkjet printing.

Composition A was jetted onto a glass substrate in areas of 1 in$^2$ using an ink jet device to form Printed Mask A with a thickness of approximately 25 μm.

Example 3

Strippability of Printed Mask A

Printed Mask A was stripped away by applying an alkaline base solution (50° C.) comprising 1.2 weight percent potassium carbonate dissolved in water with a rotospray apparatus. The substrate was then drip-rinsed for 10 seconds with deionized water.

Example 4

Preparation of Composition B

UNICID 350 was filtered through a Whatman No. 3 filter paper and Mott 40-micron filter disc with 9 grams of DARCO G-60 and 19 grams of diatomaceous earth. An composition was then prepared by mixing the filtered UNICID 350 (425.6 parts by weight) with 435.0 parts by weight of docosanoic acid (behenic acid), 90 parts by weight of UNIREZ 2970 (a polyamide resin) and 240.0 parts by weight of KE-100 (a tackifier) at 130° C. for two hours in a three lobe impeller at 445 RPM. After mixing, the mixture was cooled to 105° C. and filtered through a Whatman No. 3 membrane on a Mott 40-micron filter disc.

Example 5

Printing of Composition B to Form Printed Mask

Before printing on a glass substrate, the viscosity, melting temperature and solidification temperature of Composition B were each measured to verify that Composition B was suitable for inlcjet printing. The viscosity of Composition B at various temperatures was measured using a Brookfield Rheometer. These viscosity results are illustrated below in Table 2.

TABLE 2

Viscosity Results of Example 2

| Temperature (° C.) | Viscosity (cP) |
|---|---|
| 90.1 | 21.09 |
| 95.1 | 18.51 |
| 99.9 | 16.05 |
| 105.1 | 14.28 |
| 110.0 | 12.51 |
| 114.9 | 11.25 |
| 120.0 | 10.02 |

Figure 2:
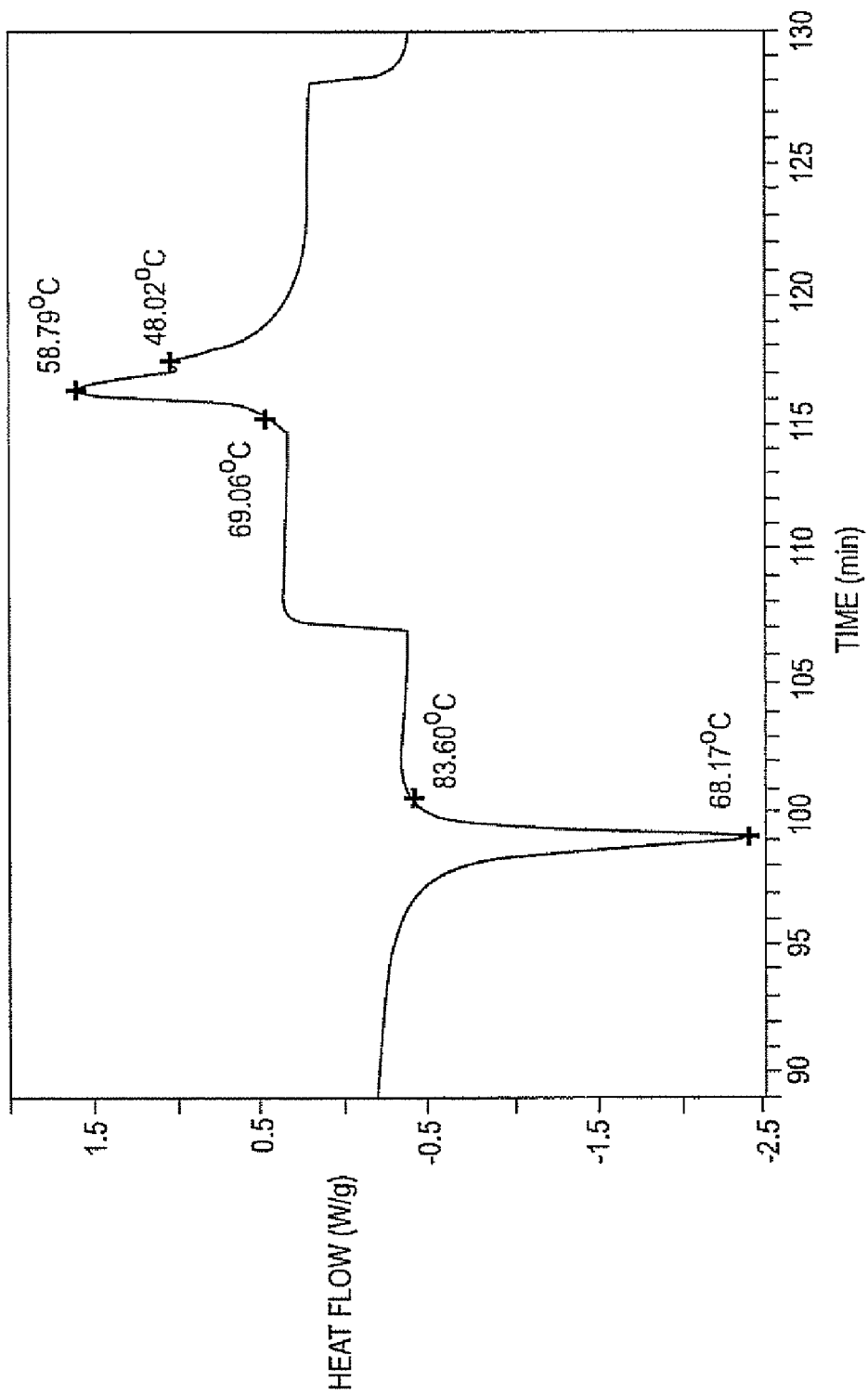

Furthermore, the melt temperature and the solidification temperature of Composition B were measured using a differential scanning calorimetry device (DSC). As shown in FIG. 2, the melting temperature of Composition B was 68.17° C. and the solidification temperature was 58.79° C. The results in Table 2 and FIG. 2 indicate that Composition B was suitable for inkjet printing.

Composition B was jetted onto a glass substrate in areas of 1 in$^2$ using an ink jet device to form Printed Mask B with a thickness of approximately 5 μm.

Example 6

Strippability of Printed Mask B

Printed Mask B is stripped away by applying an alkaline base solution (50° C.) comprising 1.2 weight percent potassium carbonate dissolved in water with a rotospray apparatus. The substrate is then drip-rinsed for 10 seconds with deionized water.

It will be appreciated that various of the above-disclosed and other features and functions, or alternatives thereof, may be desirably combined into many other different systems or applications. Also, various presently unforeseen or unanticipated alternatives, modifications, variations or improvements therein may be subsequently made by those skilled in the art, and are also intended to be encompassed by the following claims.

What is claimed is:

1. A printed mask derived from a composition comprised of at least one compound including at least one alkaline-hydrolyzable group, and at least one compound including at least one ethylene oxide group,
    wherein the printed mask is removable using an alkaline solution in about 30 seconds or less, and wherein the composition does not include an ultraviolet absorber.

2. The printed mask of claim 1, wherein the composition further comprises an alcohol of the formula

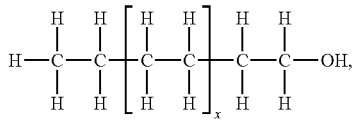

wherein x is an integer of from about 8 to about 30.

3. The printed mask of claim 1, wherein the composition has a melting point of about 40° C. to about 65° C.

4. The printed mask of claim 1, wherein the composition further comprises at least one additive selected from the group consisting of a plasticizer, a tackifier, a polyamide resin, a biocide, an antioxidant and an adhesive.

5. The printed mask of claim 1, wherein the at least one compound including the at least one alkaline-hydrolyzable group is an aliphatic carboxylic acid having from about 10 to about 25 carbon atoms.

6. The printed mask of claim 5, wherein the at least one compound including at least one alkaline-hydrolyzable group is a compound that contains two alkaline-hydrolyzable groups.

7. The printed mask of claim 1, wherein the compound that contains two alkaline-hydrolyzable groups is an unsubstituted or substituted dioic acid of the formula

wherein a is an integer from about 10 to about 24 and b is an integer twice the value of a.

8. The printed mask of claim 1, wherein the at least one compound including the at least one ethylene oxide group is an ethoxylated alcohol of the formula

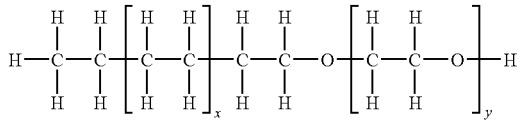

wherein x is an integer of from about 1 to about 50 and y is an integer of from about 1 to about 70.

9. The printed mask of claim 8, wherein the ethoxylated alcohol is comprised of about four ethylene oxide groups to about ten ethylene oxide groups per molecule of the ethoxylated alcohol.

10. The printed mask of claim 1, wherein the at least one compound including ethylene oxide groups is present in the composition in an amount of at least 0.5 percent by weight of composition to about 50 percent by weight of the composition.

11. The printed mask of claim 1, wherein the composition has a melting point of about 40° C. to about 65° C.

12. A method of forming a pattern on a substrate, the method comprising:

applying a metal layer to the substrate, selectively applying a composition to the metal layer to form a composite structure, wherein the composition is comprised of:

at least one compound including one alkaline-hydrolyzable group, and at least one compound including at least one ethylene oxide group, contacting the composite structure with an etching solution to remove portions of the metal layer not covered by the composition, and applying an alkaline solution after contacting the composite structure with an etching solution to remove the composition in about 30 seconds or less to form the image on the substrate, wherein the composition does not include an ultraviolet absorber.

13. The method of claim 12, wherein the alkaline solution is an alkali hydroxide or alkali carbonate solution.

14. The method of claim 12, wherein the composition is selectively applied to the metal layer by an ink jet device.

* * * * *